(12) United States Patent
Harris et al.

(10) Patent No.: US 7,438,948 B2
(45) Date of Patent: Oct. 21, 2008

(54) METHOD FOR COATING A SUBSTRATE WITH AN UNDERCOATING AND A FUNCTIONAL COATING

(75) Inventors: Caroline S. Harris, Pittsburgh, PA (US); Cory D. Steffek, Pittsburgh, PA (US); Scott D. Walck, Allison Park, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 214 days.

(21) Appl. No.: 11/085,328

(22) Filed: Mar. 21, 2005

(65) Prior Publication Data

US 2006/0210810 A1    Sep. 21, 2006

(51) Int. Cl.
*B05D 5/06* (2006.01)
(52) U.S. Cl. ............... 427/166; 427/255.36; 427/255.5; 427/255.7; 427/424; 427/427; 204/192.1; 204/192.26; 65/60.2; 65/60.5
(58) Field of Classification Search ............... 427/161, 427/248.1, 255.31, 453, 576, 166, 255.36, 427/255.5, 255.7, 424, 427; 204/192.1, 192.26; 65/60.2, 60.5
See application file for complete search history.

(56) References Cited

U.S. PATENT DOCUMENTS

| | | | | |
|---|---|---|---|---|
| 3,660,061 | A | 5/1972 | Donely et al. ................ 65/32 |
| 4,111,150 | A | 9/1978 | Donely et al. ................ 118/7 |
| 4,216,259 | A * | 8/1980 | Groth ........................ 428/216 |
| 4,379,040 | A | 4/1983 | Gillery ................... 204/192 P |
| 4,719,126 | A | 1/1988 | Henry ...................... 427/165 |
| 4,719,127 | A | 1/1988 | Greenberg ................. 427/165 |
| 4,853,257 | A | 8/1989 | Henry ...................... 427/166 |
| 4,861,669 | A | 8/1989 | Gillery ...................... 428/434 |
| 4,900,633 | A | 2/1990 | Gillery ...................... 428/432 |
| 4,971,843 | A | 11/1990 | Michelotti et al. ........... 428/34 |
| 5,071,796 | A | 12/1991 | Jones et al. ................. 501/70 |
| 5,352,640 | A | 10/1994 | Combes et al. .............. 501/71 |
| 5,464,657 | A | 11/1995 | Athey et al. ............. 427/255.5 |
| 5,545,596 | A | 8/1996 | Alverez Casariego et al. . 501/71 |
| 5,599,387 | A | 2/1997 | Neuman et al. ........ 106/287.14 |
| 5,604,626 | A * | 2/1997 | Teowee et al. .............. 359/265 |
| 5,688,727 | A | 11/1997 | Shelestak et al. ............. 501/71 |
| 5,780,372 | A | 7/1998 | Higby ........................ 501/70 |
| 5,807,417 | A | 9/1998 | Boulos et al. ............. 65/134.3 |
| 5,837,629 | A | 11/1998 | Combes et al. .............. 501/70 |
| 5,869,187 | A * | 2/1999 | Nakamura et al. .......... 428/428 |
| 5,935,717 | A * | 8/1999 | Oishi et al. ................ 428/1.51 |
| 5,948,131 | A | 9/1999 | Neuman .................... 65/60.2 |
| 6,013,372 | A * | 1/2000 | Hayakawa et al. ....... 428/411.1 |
| 6,027,766 | A * | 2/2000 | Greenberg et al. .......... 427/226 |
| 6,037,289 | A * | 3/2000 | Chopin et al. .................. 502/2 |
| 6,071,623 | A * | 6/2000 | Sugawara et al. ........... 428/428 |
| 6,103,363 | A * | 8/2000 | Boire et al. ................. 428/325 |
| 6,191,062 | B1 * | 2/2001 | Hayakawa et al. .......... 502/159 |
| 6,679,978 | B2 * | 1/2004 | Johnson et al. ........ 204/192.22 |
| 6,833,089 | B1 * | 12/2004 | Kawahara et al. ......... 252/520.2 |
| 2002/0150681 | A1 * | 10/2002 | Boire et al. ............ 427/255.36 |
| 2003/0027000 | A1 * | 2/2003 | Greenberg et al. .......... 428/432 |
| 2003/0087073 | A1 * | 5/2003 | Kobayashi .................. 428/209 |

OTHER PUBLICATIONS

Paz, Luo, Rabenberg and Heller. "Photooxidative self-cleaning transparent titanium dioxide films on glass". J. Mater. Res., vol. 10, No. 11, Nov. 1995, 2842-2848. 1995 Materials Research Society.
Remillart, McBride, Nietering, Drews and Zhang. "Real Time in Situ Spectroscopic Ellipsometry Studies of the Photocatalytic Oxidation of Stearic Acid on Titania Films". J. Phys. Chem B2000, 104, 4440-4447.

* cited by examiner

*Primary Examiner*—Bret Chen
(74) *Attorney, Agent, or Firm*—Andrew C. Siminerio

(57) ABSTRACT

A method for forming a coated substrate is disclosed. The method comprises depositing an undercoating layer and depositing a functional coating comprising a material which can be present in more than one crystal structure over the undercoating layer, wherein there is a critical deposition thickness at which the functional coating transforms from a first polycrystalline film made up predominantly of the material having a first crystal structure to a second polycrystalline film made up predominantly of the same material having a second crystal structure.

6 Claims, 2 Drawing Sheets

METHOD FOR COATING A SUBSTRATE WITH AN UNDERCOATING AND A FUNCTIONAL COATING

FIELD OF THE INVENTION

The present invention relates to substrates coated with a polycrystalline functional coating; especially substrates coated with a functional coating comprising a material that can be present in more than one crystal structure, like titania, wherein the functional coating can comprise a first polycrystalline film made up predominantly of material having a first crystal structure and a second polycrystalline film made up predominantly of the same material having a second crystal structure.

BACKGROUND OF THE INVENTION

Substrates like glass are used in a variety of applications such as architectural applications, automotive applications, aircraft applications, etc. Oftentimes, the substrates must be coated with a functional coating(s) to exhibit the required performance properties. Examples of functional coatings include electroconductive coatings, photocatalytic coatings, thermal management coatings, hydrophilic coatings, etc.

A photocatalytic coating can be applied on, for example, a glass substrate, to help keep the surface of the glass free of common organic surface contaminants. The photocatalytic coating works in the following manner: when the photocatalytic coating is exposed to light, the coating absorbs photons, generates electron-hole pairs and, in the presence of water or moisture, generates highly reactive hydroxyl radicals that tend to oxidize organic materials on the coated substrate. Ultimately, any organic material on the surface of the coated substrate gets converted to a more volatile, lower molecular weight material that can evaporate away or be washed away.

Titania ($TiO_2$) is well known in the art as a material that has good photocatalytic properties. Conventionally, a $TiO_2$ coating is a polycrystalline layer made up of numerous crystallites having the same crystal structure. In a coating composition, $TiO_2$ can be present in one of the following crystal structures: anatase, rutile and brooktite. Depending on the crystal structure of $TiO_2$ present in the coating, the coating will exhibit different performance properties, i.e. photocatalytic activity, UV induced hydrophilicity, durability, etc. For example, a coating made up of $TiO_2$ crystallites having the anatase crystal structure has a higher photocatalytic activity than a coating made up of $TiO_2$ crystallites having the rutile or brooktite crystal structures.

Polycrystalline functional coatings like $TiO_2$ coatings can be deposited on a substrate using a variety of techniques. For example, well known techniques such as spray pyrolysis, chemical vapor deposition ("CVD") and magnetron sputtered vacuum deposition ("MSVD") can be used to deposit a $TiO_2$ coating on a glass substrate. The advantage of spray pyrolysis and CVD over other techniques for depositing a $TiO_2$ coating on a glass substrate is they can be utilized on a float glass line during a glass production process. A further benefit of a CVD process is that it utilizes heat in the glass substrate as a result of the glass making process to degrade CVD precursors and form a durable coating. If the $TiO_2$ coating is applied on-line during the glass making operation, the $TiO_2$ coated glass can be produced at a reduced cost due to the efficiency of the process.

Regardless of the process used to deposit a polycrystalline functional coating on a glass substrate, there is no process available at the current time for depositing a functional coating made up of a certain material like $TiO_2$ under fixed deposition conditions, wherein the deposited functional coating can comprise a first polycrystalline film made up predominantly of material having a first crystal structure and a second polycrystalline film made up predominantly of the same material having a second crystal structure. For example, there is no process currently available for depositing a photocatalytic coating comprising $TiO_2$ on a float glass line under standard operating conditions, wherein the deposited functional coating comprises a first polycrystalline film made up predominantly of $TiO_2$ having the rutile crystal structure and a second polycrystalline film made up predominantly $TiO_2$ having the anatase crystal structure.

The present invention provides a method for depositing a functional coating comprising a material that can be present in more than one crystal structure over a substrate, wherein the functional coating is made up of one or more films comprised predominantly of a material having different crystal structures. The method of the invention can be used to deposit multi-film functional coatings which are designed for optimization of at least one property such as photocatalytic activity, durability, etc.

SUMMARY OF THE INVENTION

In a non-limiting embodiment, the present invention is a method for forming a coated substrate comprising: depositing an undercoating layer; and depositing a functional coating comprising a material which can be present in more than one crystal structure over the undercoating layer, wherein there is a critical deposition thickness where the functional coating transforms from a first polycrystalline film made up predominantly of material having a first crystal structure to a second polycrystalline film made up predominantly of material having a second crystal structure which is different from the first crystal structure.

In another non-limiting embodiment, the present invention is a coated substrate comprising: an undercoating layer; and a photocatalytic coating over the undercoating layer comprising a first polycrystalline film made up predominantly of material having a first crystal structure and a second polycrystalline film made up predominantly of material having a second crystal structure.

In a further embodiment, the present invention is a method for adjusting the critical deposition thickness of a functional coating made up of material predominantly having a first crystal structure and having a first lattice parameter comprising: including an undercoating layer made up predominantly of material having a second crystal structure and having a second lattice parameter under the functional coating and changing the first and/or the second lattice parameter.

DESCRIPTION OF THE INVENTION

Figure 1:
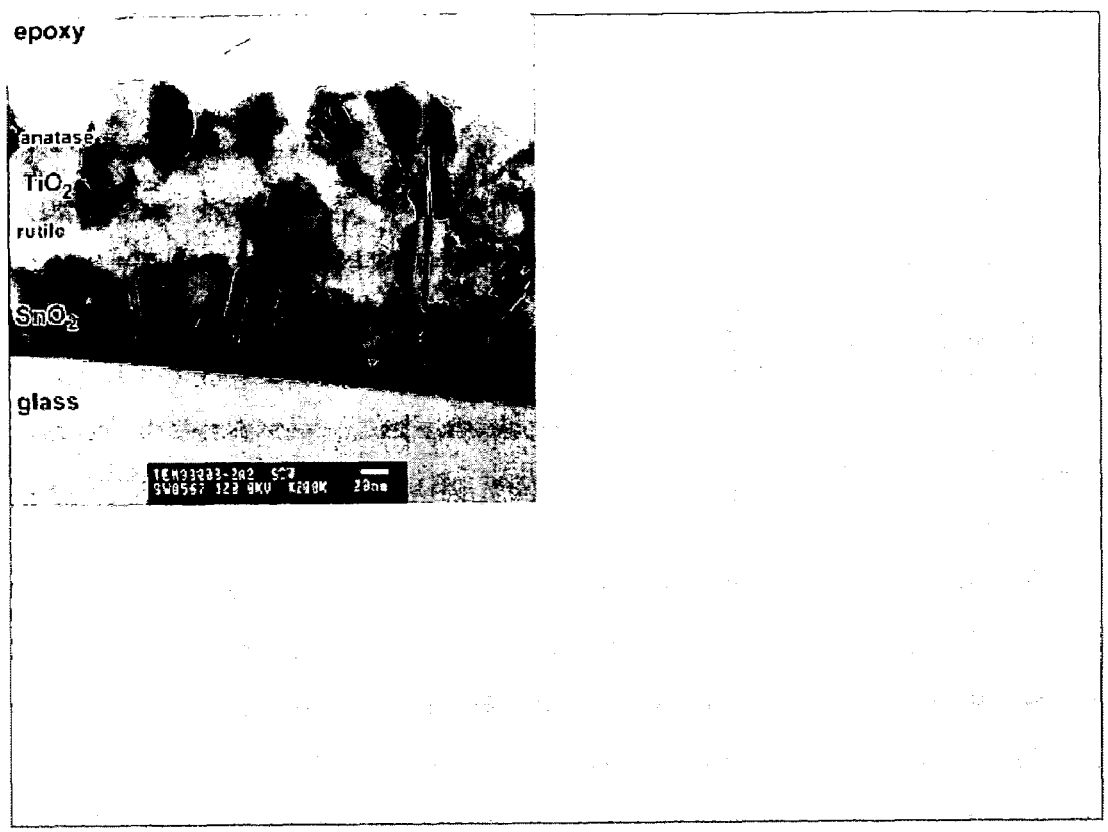
FIG. 1. is a Transmission Electron Microscopy ("TEM") image of a coated substrate according to the present invention.

All numbers expressing dimensions, physical characteristics, quantities of ingredients, reaction conditions, and the like used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub-ranges subsumed therein. For example, a stated range of "1 to 10" should be considered to include any and all sub-ranges between (and inclusive of) the minimum value of 1 and the maximum value of 10; that is, all sub-ranges beginning with a minimum value of 1 or more and ending with a maximum value of 10 or less, e.g., 1.0 to 7.8, 3.0 to 4.5, 6.3 to 10.0.

As used herein, spatial or directional terms, such as "left", "right", "inner", "outer", "above", "below", "top", "bottom", and the like, are understood to encompass various alternative orientations and, accordingly, such terms are not to be considered as limiting.

As used herein, the terms "on", "applied on/over", "formed on/over", "deposited on/over", "overlay" and "provided on/over" mean formed, deposited, or provided on but not necessarily in contact with the surface. For example, a coating layer "formed over" a substrate does not preclude the presence of one or more other coating layers of the same or different composition located between the formed coating layer and the substrate. For instance, the substrate can include a conventional coating such as those known in the art for coating substrates, such as glass or ceramic.

As used herein, the term "coating" refers to one or more polycrystalline layers made up of numerous crystallites, or crystal structures, and possibly one or more amorphous layers. The size of the crystallites in the in-plane dimension can vary greatly, for example, the size can range in size from 5 nm to 100 nm. Each layer can be made up of one or more "films". Each layer or film can be continuous or non-continuous depending on its thickness. Depending on the crystal structure and the d-spacings of the crystal structures, a coating will have specific lattice parameters.

As used herein, the terms "crystallite" or "crystal structure" refers to the type of crystallinity exhibited by a material. A material may exist in one or more different crystal structures. For example, $TiO_2$ can exist in the following crystal structures: anatase, rutile, or brookite.

For the purposes of the present invention, the crystal structure of a material is determined in the following manner. The diffraction intensity of the material is measured as a function of 2-theta angle using a standard diffraction technique such as XRD, TEM, etc. and recorded in a diffraction pattern. The measured diffraction pattern for the material is then compared to standard diffraction data contained in a crystallographic database as is well known in the art. The crystal structure of the material is determined to be that of the standard having the appropriate chemistry that is the closest match. The International Centre for Diffractions Data (ICDD) maintains Powder Diffraction Files (PDF) for different crystal structures as measured by various diffraction techniques. For example, File No. 21-1272 (shown in FIG. 2) is the standard for $TiO_2$ having the anatase crystal structure as measured by XRD.

For illustration, the diffraction intensity of a $TiO_2$ sample could be measured using XRD and recorded in a diffraction pattern. The measured diffraction pattern would be compared to standard XRD diffraction patterns for $TiO_2$. If the measured diffraction pattern most closely matched the standard diffraction pattern for $TiO_2$ having anatase crystal structures, it would be determined that the material was $TiO_2$ having anatase crystal structures.

As used herein, the term "rutile crystal structure" refers to a layer or film that exhibits detectable diffraction intensity for the rutile crystal structure as measured by at least one of the following diffraction techniques: XRD, neutron diffraction, TEM, etc.

As used herein, the term "anatase crystal structure" refers to a layer or film that exhibits detectable diffraction intensity for the anatase crystal structure as measured by at least one of the following diffraction techniques: XRD, neutron diffraction, TEM, etc.

As used herein, the term "amorphous" is used to refer to a layer or film that cannot be described as exhibiting any known crystal structure.

As used herein, the term "exposed surface" refers to the surface of a coating which is in contact with the external environment. The exposed surface is the outermost portion of the coating.

As used herein, the term "predominantly" is used to describe something, for example, a crystal structure, that is present in a the greatest amount by volume when compared to other similar things.

In a non-limiting embodiment, the present invention is a method for forming a coated substrate comprising depositing a single or multi-film functional coating comprising a material that can be present in more than one crystal structures over a substrate. If a multi-film functional coating is deposited, the functional coating comprises a first polycrystalline film made up predominantly of material having a first crystal structure and a second polycrystalline film made up predominantly of the same material having second crystal structure, which is different from the first crystal structure.

In one non-limiting embodiment, the method of the present invention comprises depositing an undercoating layer over at least a portion of the substrate and depositing a functional coating over at least a portion of the undercoating layer. According to the present invention, the step of depositing the undercoating layer can be accomplished using conventional application techniques such as chemical vapor deposition ("CVD"), spray pyrolysis, and magnetron sputtered vacuum deposition ("MSVD") as are well known in the art.

Suitable CVD methods of deposition are described in the following references, which are hereby incorporated by reference: U.S. Pat. Nos. 4,853,257; 4,971,843; 5,464,657; 5,599,387; and 5,948,131.

Suitable spray pyrolysis methods of deposition are described in the following references, which are hereby incorporated by reference: U.S. Pat. Nos. 4,719,126; 4,719,127; 4,111,150; and 3,660,061.

Suitable MSVD methods of deposition are described in the following references, which are hereby incorporated by reference: U.S. Pat. Nos. 4,379,040; 4,861,669; and 4,900,633.

Other well known deposition techniques such as plasma enhanced CVD ("PECVD") and plasma assisted CVD ("PACVD") can be utilized in the present invention.

The undercoating layer of the present invention can be deposited at any thickness. For example, the thickness of the deposited undercoating layer can range from at least 1 nm, for example, from 10 nm to 1,000 nm, or from 10 nm to 500 nm, or from 10 nm to 100 nm. The exact thickness of the undercoating layer is generally determined by the end use of the coated substrate.

The undercoating layer can comprise any material that will affect the crystal structure of any subsequently deposited layer or film.

In a non-limiting embodiment of the present invention, the undercoating comprises a material in a rutile crystal structure. For example, the undercoating can comprise tin oxide ($SnO_2$) (also referred to as cassiterite), germanium dioxide ($GeO_2$), beta manganese dioxide ($\beta$-$MnO_2$), chromium (IV) oxide ($CrO_2$), iridium oxide ($IrO_2$), osmium (IV) oxide ($OsO_2$), ruthenium (IV) oxide ($RuO_2$), tantalum (IV) oxide ($TaO_2$), niobium (IV) oxide ($NbO_2$), molybdenum (IV) oxide ($MoO_2$), tungsten (IV) oxide ($WO_2$), lead (IV) oxide ($PbO_2$) and mixtures thereof.

In another non-limiting embodiment of the present invention, the undercoating layer comprises a material in a brooktite crystal structure. For example, the undercoating layer can comprise tellurium oxide ($TeO_2$).

The rutile crystal structure is in the tetragonal system, and the brooktite crystal structure is in the orthorhombic system. Within each system, there are several space groups, such as $I4_1/amd$ and $P4_2/mnm$ in the tetragonal system.

The undercoating layer is not limited to any particular space group or crystal system. In yet another non-limiting embodiment of the invention, the undercoating layer comprises a material in one of the following crystal systems: triclinic, monoclinic, trigonal, hexagonal, cubic or any combination thereof.

In a non-limiting embodiment of the invention, the undercoating layer can be doped to modify the stoichiometry of the undercoating layer as is well known in the art. The dopant can also be used to change the lattice parameters of the crystal structure of the undercoating. For example, the undercoating layer can be doped with a cation such as iron, zinc, boron, etc. and/or with an anion such as carbon, nitrogen, etc. The material used to form the undercoating layer can be co-doped, i.e., the lattice of the material is doped with at least one cation and at least one anion.

According to the present invention, after the undercoating layer is deposited, a functional coating comprising a material that can be present in more than one crystal structure is deposited over the undercoating layer. The functional coating can be any functional coating known in the art. In a non-limiting embodiment of the invention, the functional coating comprises a photocatalytic coating. The photocatalytic coating can comprise at least one metal oxide, such as but not limited to, one or more metal oxides or semiconductor metal oxides. Suitable metal oxides include titanium oxides (also referred to as titania ($TiO_2$)), iron oxides, tungsten oxides, zinc oxides, tin oxides, zinc/tin oxides, calcium titanium oxides, molybdenum oxides, niobium oxides, vanadium oxide, as well as mixtures thereof.

According to the present invention, the material that makes up the functional coating can be doped as is well known in the art. Suitable dopants include those discussed above in relation to the undercoating layer.

The functional coating can be applied using any of the standard deposition techniques discussed above in relation to the undercoating layer. One skilled in the art knows what deposition technique to use based on the requirements of the coated substrate.

The functional coating can be deposited at any thickness. For example, the total deposited functional coating ranging from 10 nm to 250 nm, for example, at least 20 nm, or at least about 40 nm, or at least about 50 nm.

Depending on the thickness of the deposited functional coating, the functional coating deposited over the undercoating will either be (1) a single film functional coating comprised predominantly of material having a first crystal structure or (2) a multi-film functional coating comprised of a first polycrystalline film made up predominantly of material having a first crystal structure and a second polycrystalline film made up predominantly of the same material having a second crystal structure which is different from the first crystal structure.

The deposition thickness at which the functional coating transforms from a first polycrystalline film made up predominantly of a material having the first crystal structure to a second polycrystalline film made up predominantly of the same material having the second crystal structure is referred to herein as the "critical deposition thickness". This transformation takes place because as the crystal structures grow, the strain energy increases with layer thickness and a different crystal structure becomes more energetically favorable. The more energetically favorable crystal structure starts to grow to relieve the strain energy. The critical deposition thickness depends on, among other things, the composition of undercoating layer, the composition of the functional layer and the deposition temperature.

The critical deposition thickness can be manipulated by changing the deposition conditions and/or the lattice mismatch between crystallites that make up the undercoating layer and crystallites that make up the functional coating. In a non-limiting embodiment of the invention, the undercoating layer can be doped to increase the lattice mismatch between the undercoating layer and the functional coating to decrease the critical deposition thickness. The present invention encompasses a method for manipulating the critical deposition thickness of a functional coating.

In a non-limiting embodiment of the present invention, the functional coating is a photocatalytic coating comprising $TiO_2$ and the undercoating layer comprises tin oxide having the rutile crystal structure. When the temperature of the substrate is 1230° F. (666° C.), the critical deposition thickness for this embodiment is 60 nm. Consequently, $TiO_2$ having the rutile crystal structure will be deposited to a thickness of 60 nm. If the $TiO_2$ film is deposited at thickness that is greater than 60 nm, a second polycrystalline film of the functional coating made up of predominantly $TiO_2$ having the anatase crystal structure will start to deposit.

Thus, the present invention provides a method for forming a coated substrate with a functional coating comprising a first polycrystalline film made up of $TiO_2$ having the rutile crystal structure if the $TiO_2$ coating is deposited at a thickness of less than 60 nm. If the $TiO_2$ coating is deposited at a thickness exceeding 60 nm, a coated substrate is formed with a functional coating comprising a first polycrystalline film made up predominantly of $TiO_2$ having the rutile crystal structure and a second polycrystalline film made up predominantly of $TiO_2$ having the anatase crystal structure.

Depending on the end use of the coated substrate, the composition of the multi-film functional coating can be optimized. For example, the composition of the functional coating can be optimized to provide maximum photocatalytic activity by depositing a film of $TiO_2$ having the anatase structure over a film of $TiO_2$ having the rutile structure.

In a non-limiting embodiment, the method of the present invention can be carried out on a float glass line during a glass making operation as is well known in the art. Either a CVD or spray pyrolytic coating apparatus can be set up on the float line to deposit the undercoating layer of the present invention and to deposit the functional coating of the present invention. An appropriate precursor for the desired undercoating layer is projected toward a portion of the glass substrate floating on a molten tin bath, in a manner well known in the art, to deposit the undercoating layer.

Next, an appropriate precursor for the desired functional coating is projected toward a portion of the glass substrate floating on a molten tin bath to deposit the functional coating. Initially, the crystalline grains are typically oriented randomly. As the functional coating is deposited and the crystallites continue to grow on the surface of the underlayer coated glass, a particular crystallographic structure becomes predominant in the film. The predominant crystallographic structure is determined by the energetics of the system. The most energetically favorable crystallographic structure will be the predominant one.

The appropriate precursors for CVD and spray pyrolysis deposition techniques are well known to those skilled in the art.

In a non-limiting embodiment where the functional coating comprises $TiO_2$, the $TiO_2$ can be present in one or more of the following crystal structures: rutile, anatase and brooktite. As discussed above, the predominant crystallographic structure formed during the deposition process is the one that is most energetically favorable under the deposition conditions.

Under standard operating conditions on a float glass line, a $TiO_2$ coating deposited directly on a glass substrate will have anatase crystallites as the predominant crystal structure. By standard conditions, it is meant a coating operation carried out on a glass substrate at a temperature ranging from 1200° F. to 1250° F. during a glass making operation. In general, when a $TiO_2$ coating is deposited directly on a glass substrate at a temperature up to 1472° F., $TiO_2$ having the antase crystal structure gets nucleated.

In order to nucleate a $TiO_2$ coating having the rutile crystal structure directly on a float glass ribbon during a glass making operation, the temperature of the substrate would have to be greater than 1472° F. However, at such a high temperature, the glass ribbon is not fully formed and stable. As a result, it is not practical to apply a coating on a glass substrate on a float line at such a temperature so it is not currently possible to deposit a coating comprised predominantly of $TiO_2$ having the rutile crystal structure on a glass substrate on a float glass line during a glass making operation without following the present invention. Consequently, it is not currently possible, without following the present invention, to deposit a functional coating comprising a first polycrystalline film made up predominantly of $TiO_2$ having the rutile crystal structure and a second polycrystalline film made up predominantly of $TiO_2$ having the anatase crystal structure on a glass substrate on a float glass line during a glass making operation.

Although the method of the present invention is described above in the context of a float glass process, the present invention is not limited to a coating operation involving a glass substrate and/or a float line process.

In various non-limiting embodiments, the present invention can comprise further steps. In one non-limiting embodiment, the present invention can further comprise depositing one or more coating layers under and/or over the functional coating.

In another non-limiting embodiment, the present invention can further comprise the step of activating a photocatalytic coating. Generally, a photocatalytic coating can be activated using radiation in the ultraviolet range, e.g. 300-400 nm of the electromagnetic spectrum.

According to the present invention, suitable substrates include, but are not limited to, polymers, ceramics and glass. The substrate can be glass of any type, such as conventional float glass or flat glass. The glass can be of any composition and is not limited to any specific optical properties, e.g., any value of visible transmission, ultraviolet transmission, infrared transmission, total solar energy transmission, etc. Examples of suitable glass include borosilicate glass and soda-lime-silica glass compositions, which are well known in the art. Exemplary glass compositions are disclosed in, but are not limited to, U.S. Pat. Nos. 5,071,796; 5,837,629; 5,688,727; 5,545,596; 5,780,372; 5,352,640; and 5,807,417.

Suitable ceramic substrates include oxides such as alumina, zirconia, and clay and non-oxides such as silicon carbide, alumina nitride; non-oxides; and mixtures thereof.

Suitable polymers include polymethylmethacrylate, polycarbonate, polyurethane, polyvinylbutyral (PVB) polyethyleneterephthalate (PET), or copolymers of any monomers for preparing these, or mixtures thereof.

In addition to the method discussed above, the present invention encompasses coated substrates produced by such methods. In a non-limiting embodiment, the present invention is a coated substrate comprising an undercoating layer and a functional coating that, depending on the thickness of the deposited functional coating, will either be (1) a single film functional coating comprised predominantly of material having a first crystal structure or (2) a multi-film functional coating comprised of a first polycrystalline film made up predominantly of material having a first crystal structure and a second polycrystalline film made up predominantly of the same material having a second crystal structure that is different from the first crystal structure.

In a non-limiting embodiment, the present invention is a coated glass substrate comprising an undercoating layer comprising tin oxide and a functional coating comprising a first polycrystalline film made up predominantly of $TiO_2$ having the rutile crystal structure and a second polycrystalline film made up predominantly of $TiO_2$ having the anatase crystal structure.

According to the present invention, the undercoating layer affects the crystal structures present in the functional coating. The undercoating layer can also serve other purposes. For example, the undercoating layer can be used to prevent the migration of ions, such as sodium ions, from a glass substrate into the functional coating. Such migration can negatively impact the functional coating. As another example, the undercoating layer can affect the optical properties of the coated substrate, i.e., it can be used as a color suppression layer.

Coated substrates according to the present invention can demonstrate improved performance properties over conventional coated substrates. For example, when a photocatalytic coating is made up of films having different crystal structures as discussed above, the electron-hole pairs are created due to the electronic properties of the two crystal structures, but the charges have an increased duration of separation before recombination as a result of the presence of two different crystal structures. Due to the increased duration of charge separations between the electrons and holes produced during activation of the photocatalytic coating, the multi-film photocatalytic coating can exhibit improved photocatalytic activity. Also, the coated substrate can exhibit photocatalytic activity over a broader wavelength range due to the presence of a film, for example, $TiO_2$ doped with nitrogen, which has photocatalytic activity in the visible spectrum.

In a non-limiting embodiment, a coated substrate according to the present invention is incorporated into an insulating glass (IG) unit as is well known in the art. The IG unit can include a first glass substrate pane spaced from a second glass substrate pane by a spacer assembly and held in place by a sealant system to form a chamber between the two glass substrates as is well known in the art. Examples of suitable IG units are disclosed in U.S. Pat. Nos. 4,193,236; 4,464,874; 5,088,258; and 5,106,663, which are hereby incorporated by reference.

A coated substrate according to the present invention can be utilized as the first and/or the second glass substrate in an IG unit. The functional coating can be deposited on any surface of either glass substrate. In a non-limiting embodiment, where the functional coating is a photocatalytic coating, the coated substrate of the present invention is the outer glass substrate and the coating is on the exposed outer glass surface of the IG unit. Other types of coatings can be deposited over one or more of the other surfaces.

EXAMPLES

The present invention is illustrated by the following non-limiting examples (Examples 1-4). All of the examples except for Example 4 were made in the following manner: an undercoating layer comprised of tin oxide was deposited on the air side of a soda-lime-silica float glass ribbon using a CVD coater as is known in the art. The float glass was clear float glass, which is commercially available from PPG Industries, Inc in Pittsburgh, Pa. The thickness of the deposited undercoating layer for each example is shown in Table 1.

After the undercoating layer was deposited, a $TiO_2$ coating was deposited over the undercoating layer using a second CVD coater as is well known in the art. The thickness of the deposited $TiO_2$ coating for each example is shown in Table 1. After the $TiO_2$ coating was deposited, the glass ribbon underwent a standard annealing process and was cut into a glass sheet. The glass sheet was approximately 3 mm (0.12 inches) thick.

For Example 4, a $TiO_2$ coating was deposited directly on the glass using a CVD coater as discussed above. There was no undercoating layer. After the $TiO_2$ coating was deposited, the substrate was subjected to the annealing and cutting process described above.

TABLE 1

Compositions of the Exemplary Coated Substrates

|  | Example 1 | Example 2 | Example 3 | Example 4 |
|---|---|---|---|---|
| Undercoating [nm] | 84.6 | 75.8 | 82.2 | 0 |
| Functional coating [nm] | 57.3 | 107.3 | 145.6 | 169 |

Example 3 was subjected to analysis using TEM. The resulting image as shown in FIG. 1 illustrates a cross sectional view of an undercoating layer comprising tin oxide under a multi-film, $TiO_2$ functional coating comprising a film of $TiO_2$ having the rutile crystal structure under a film of $TiO_2$ having the anatase crystal structure. The epoxy shown in FIG. 1 is present as a result of how samples are prepared for TEM analysis.

All of the examples were subjected to XRD analysis. The XRD analysis was performed using a Philips X-Pert MPD™ x-ray diffractometer using the glancing angle method and the peaks were compared to standard x-ray diffraction identification cards (PDF cards) commercially available from ICDD. The test results were plotted in graphs having 2-Theta (degree) on the "x" axis and intensity in counts on the "y" axis as shown in FIG. 2.

Figure 2:
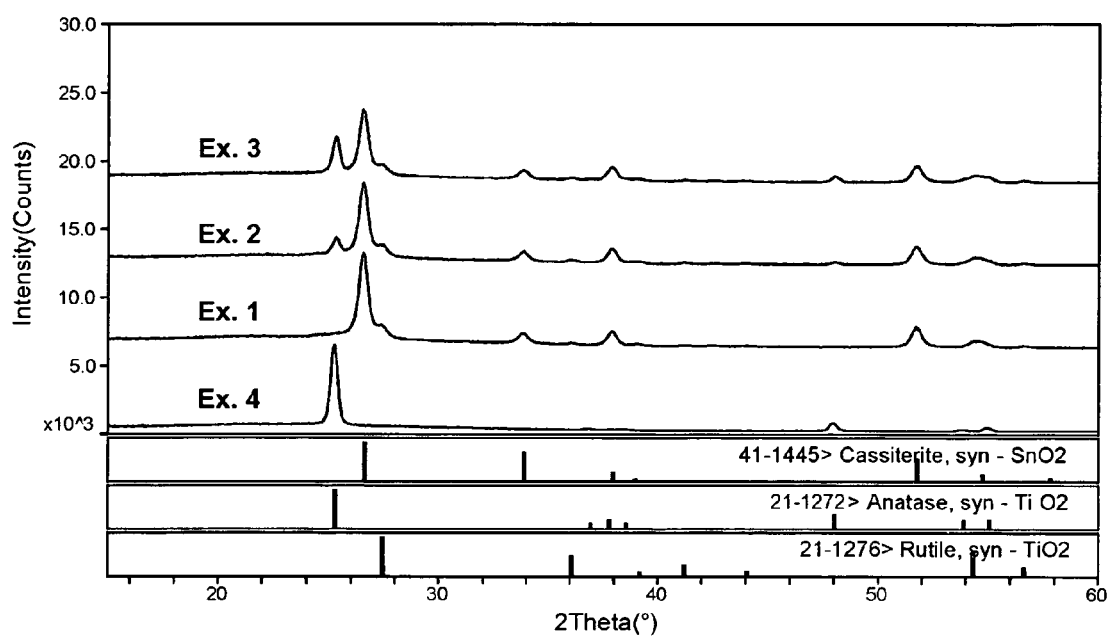
FIG. 2. is an X-ray Diffraction ("XRD") pattern of a coated substrate according to the present invention.

The standard x-ray diffraction pattern for $TiO_2$ having the anatase crystal structure and $TiO_2$ having the rutile crystal structure appear at the bottom of each FIG. 2. The current standard x-ray diffraction patterns for $TiO_2$ having the anatase crystal structure and $TiO_2$ having the rutile crystal structure are identified by file numbers, "21-1272 Anatase" and "21-1276 Rutile", respectively.

FIG. 2 shows that a $TiO_2$ coating deposited over an undercoating layer of tin oxide at a thickness of 57.3 nm results in a $TiO_2$ coating comprised predominantly of $TiO_2$ having the rutile crystal structure (Example 1). More specifically, the peaks in the Examples are generally aligned with the peaks shown for $TiO_2$ having the rutile crystal structure. As the thickness of the functional coating increases (Examples 2 and 3), the $TiO_2$ becomes a multi-film coating comprised of a first polycrystalline film of $TiO_2$ having the rutile crystal structure and a second polycrystalline film of $TiO_2$ having the anatase crystal structure, as opposed to a single polycrystalline film of $TiO_2$ having the rutile crystal structure (Example 1). As the thickness of the functional coating increases, the thickness of the film of $TiO_2$ having the anatase crystal structure gets thicker. The other peak shown in FIG. 2 for Examples 1-3 are attributable to cassiterite and arise because of the tin oxide undercoating layer.

The pattern that exhibits only the peak for $TiO_2$ having the anatase crystal structure is Example 4 where the $TiO_2$ functional coating was deposited directly over a glass substrate.

It will be readily appreciated by those skilled in the art that modifications may be made to the invention without departing from the concepts disclosed in the foregoing description. Such modifications are to be considered as included within the scope of the invention. Accordingly, the particular embodiments described in detail hereinabove are illustrative only and are not limiting as to the scope of the invention, which is to be given the full breadth of the appended claims and any and all equivalents thereof.

We claim:

1. A method for forming a coated substrate, comprising:
providing a glass substrate;
depositing an undercoating layer over the substrate; and
selectively depositing a photocatalytic functional coating comprising titania over the undercoating layer by depositing the functional coating to a thickness less than a critical deposition thickness to form a first titania film having a first crystal structure over the undercoating layer and depositing the functional coating to a thickness greater than the critical deposition thickness to form a second titania film having a second crystal structure over the first titania film, wherein the undercoating layer comprises tin oxide having a rutile crystal structure, the first titania film comprises a rutile crystal structure, and the second titania film comprises an anatase crystal structure.

2. The method of claim 1, wherein depositing the undercoating layer is accomplished using CVD, spray pyrolysis, or MSVD.

3. The method according to claim 1, wherein the thickness of the deposited undercoating layer is at least 1 nm.

4. The method according to claim 1, wherein depositing the functional coating is accomplished by CVD, spray pyrolysis, or MSVD.

5. The method according to claim 1, wherein the thickness of the deposited functional coating ranges from 10 nm to 250 nm.

6. A method of making a coated substrate in a float glass process, comprising:
providing a glass substrate in a molten metal bath, the glass substrate having a temperature in the range of 1200° F. to 1250° F.;
depositing an undercoating layer over the substrate in the molten metal bath by chemical vapor deposition, the undercoating layer comprising tin oxide in a rutile crystal structure; and
selectively depositing a photocatalytic functional coating comprising titania over the undercoating by chemical vapor deposition by depositing the functional coating to a thickness less than a critical deposition thickness to form a first titania film comprising a rutile crystal structure over the undercoating layer and depositing the functional coating to a thickness greater than the critical deposition thickness to form a second titania film comprising an anatase crystal structure over the first titania film.

* * * * *